United States Patent [19]

Ballamy et al.

[11] 3,928,092

[45] Dec. 23, 1975

[54] SIMULTANEOUS MOLECULAR BEAM DEPOSITION OF MONOCRYSTALLINE AND POLYCRYSTALLINE III(A)-V(A) COMPOUNDS TO PRODUCE SEMICONDUCTOR DEVICES

[75] Inventors: William Charles Ballamy, Reading, Pa.; Alfred Yi Cho, New Providence, N.J.

[73] Assignee: Bell Telephone Laboratories, Incorporated, Murray Hill, N.J.

[22] Filed: Aug. 28, 1974

[21] Appl. No.: 501,154

[52] U.S. Cl. .................... 148/175; 29/578; 29/580; 29/590; 148/174; 156/17; 156/612; 204/192; 357/13; 357/15; 357/48; 357/50; 357/59

[51] Int. Cl.$^{2}$.................. H01L 21/203; H01L 29/04; H01L 21/76; H01L 29/48

[58] Field of Search ............ 148/174, 175; 204/192; 29/578, 580, 590; 156/17, 612; 357/48, 50, 15, 13, 59

[56] References Cited

UNITED STATES PATENTS

| | | | |
|---|---|---|---|
| 3,476,593 | 11/1969 | Lehrer | 117/201 |
| 3,574,007 | 4/1971 | Hugle | 148/175 |
| 3,607,699 | 9/1971 | Sosniak | 204/192 |
| 3,615,931 | 10/1971 | Arthur, Jr. | 148/175 |
| 3,617,822 | 11/1971 | Kobayashi | 357/48 X |
| 3,666,553 | 5/1972 | Arthur, Jr. et al. | 148/175 X |
| 3,692,574 | 9/1972 | Kobayashi | 117/212 |
| 3,698,947 | 10/1972 | Kemlage et al. | 148/174 X |
| 3,762,945 | 10/1973 | DiLorenzo | 148/175 X |
| 3,850,685 | 11/1974 | Sakai | 148/174 X |
| 3,865,625 | 2/1975 | Cho et al. | 148/175 X |

OTHER PUBLICATIONS

Broadie, et al., "Selective Planar Gap/Si . . . Light Emitting Diodes" I.B.M. Tech. Discl. Bull., Vol. 16, No. 4, Sept. 1973, p. 1301.

Rai-Choudhury et al., "Selective Growth . . . Gallium Arsenide" J. Electro Chem. Soc., Solid State Science, Vol. 118, No. 1, Jan. 1971, pp. 107–110.

*Primary Examiner*—L. Dewayne Rutledge
*Assistant Examiner*—W. G. Saba
*Attorney, Agent, or Firm*—M. J. Urbano

[57] ABSTRACT

Described is a molecular beam technique for fabricating semiconductor devices from Group III(a)-V(a) compounds. To form planar isolated devices, an amorphous insulative layer is formed on selected portions of a monocrystalline substrate of the Group III(a)-V(a) material which is at least semi-insulating. The amorphous layer may be formed by deposition of an oxide (e.g., $SiO_2$), anodization of an oxide (e.g., native oxides) or by conversion of a surface layer of the substrate (e.g., by grit blasting). When a molecular beam containing Group III(a) and Group V(a) elements is directed at the surface, which is preheated to a temperature in the range of 450° to 675° C, monocrystalline Group III(a)-V(a) material grows on the exposed substrate whereas polycrystalline Group III(a)-V(a) material is simultaneously formed on the amorphous layer. The polycrystalline and monocrystalline surfaces are substantially coplanar. The polycrystalline material has a resistivity high enough to provide electrical isolation between active devices formed in the monocrystalline material. Examples of such active devices, which are also described, include beam-leaded Schottky barrier mixer diodes which have reduced parasitic capacitance and sealed-junction Schottky barrier IMPATT diodes. To form devices in which isolation is not required, the same procedure is followed except that neither the amorphous layer nor the substrate need be made of high resistivity material.

17 Claims, 5 Drawing Figures

SIMULTANEOUS MOLECULAR BEAM DEPOSITION OF MONOCRYSTALLINE AND POLYCRYSTALLINE III(A)-V(A) COMPOUNDS TO PRODUCE SEMICONDUCTOR DEVICES

BACKGROUND OF THE INVENTION

This invention relates to the fabrication of semiconductor devices by molecular beam techniques and more particular to the fabrication of planar isolated devices, such as Schottky barrier mixer diodes and IMPATTs, by the simultaneous deposition of monocrystalline and polycrystalline Group III(a)-V(a) material.

Prior art attempts to grow planar isolated GaAs structures for multiple devices and integrated circuits have generally utilized selective chemical vapor deposition (CVD). As described by D. W. Shaw in two articles in the *Journal of the Electrochemical Society*, Vol. 113, page 904 (1966) and Vol. 115, page 777 (1968), the CVD process involves masking the surface of a semi-insulating GaAs substrate with $SiO_2$ and removing the oxide in the areas where epitaxial growth is desired. A planar structure is achieved by etching holes several micrometers deep into the substrate in the unmasked areas. Shaw points out that since epitaxial growth by CVD requires a surface catalyzed reaction, deposition occurs only on the GaAs substrate and not on the $SiO_2$ film. One disadvantage of the CVD process is that producing a planar geometry requires precise control of growth morphology and the rate of growth so that the epitaxial surface will be level with the $SiO_2$ covered surface. In addition, the CVD process encounters the problem of facet growth as described by several workers in the art: Shaw, supra; S. Iida et al., *Journal of Crystal Growth*, Vol. 13–14, page 336 (1972); and Y. Isibashi in two articles in *Japan Journal of Applied Physics*, Vol. 9, page 1007 (1970) and Vol. 10, page 525 (1971).

Viewed from another standpoint, the prior art problem can be defined in terms of device parameters. For example, in beam-leaded devices, such as Schottky barrier mixer diodes, which operate at high frequencies in the tens of gigahertz range, parasitic capacitance inherent in the beam-leaded structure limits the diode efficiency. The parasitic capacitance arises because the beam anchor area and interconnects pass over the conducting substrate from which it is separated only by a thin insulating layer. Ths parasitic capacitance can be reduced by utilizing a mesa structure on a semi-insulating substrate. In the latter type of structure, the active device is formed on a mesa while the beam anchor area covers only the semi-insulating material. However, the fabrication of such mesa structures is difficult because it involves metallization and photoresist delineation of small details on a mesa which is typically 5 to 10 $\mu$m high. Considerable process simplification could be realized if a planar device structure could be utilized.

In this regard, the previously described CVD process has been employed in an attempt to produce planar structures by the selective deposition of epitaxial material into the pits etched into a semi-insulating substrate. Difficulties have been encountered, however, in etching uniform pits for the deposition because etch rates are strongly affected by crystal orientation. Similarly, the crystal growth rate itself is orientation dependent and difficult to control. As a result, selective epitaxial areas are not coplanar with the substrate and tend to be nonuniform in thickness.

SUMMARY OF THE INVENTION

In accordance with one embodiment of our invention, we have fabricated planar isolated GaAs devices utilizing a molecular beam technique of the type described, for example, by J. R. Arthur, Jr. in U.S. Pat. No. 3,615,931 issued on Oct. 26, 1971 and by A. Y. Cho in U.S. Pat. No. 3,751,310 issued on Aug. 7, 1973. In our process the planar isolated structure is illustratively formed by coating a GaAs substrate, preferably semi-insulating (e.g., resistivity greater than about $10^5$ $\Omega$-cm), with an amorphous insulative layer such as $SiO_2$ or a native oxide. Alternatively, preselected portions of a surface layer of the substrate may be converted to amorphous material by grit blasting or ion bombardment. In the oxide case, windows are formed in the amorphous layer where single crystal growth is desired. Subsequently, beams of Ga and As atoms/molecules, as well as dopant atoms/molecules, are directed at the masked substrate surface resulting in the simultaneous formation of monocrystalline GaAs in the windows on the exposed substrate and polycrystalline GaAs on the remaining portions of the amorphous layer. Importantly, we found that the polycrystalline material was semi-insulating even when a high concentration of dopant atoms was contained in the beam and notwithstanding that the substrate growth temperature far exceeded that taught by J. R. Arthur, Jr. and F. J. Morris in U.S. Pat. No. 3,666,553 issued on May 30, 1972.

Utilizing this process, we have fabricated low parasitic capacitance beam-leaded Schottky barrier mixer diodes. These diodes demonstrated excellent d.c. and r.f. characteristics exhibiting low conversion loss in a double balanced downconverter apparatus. Its application in the fabrication of other devices, such as IMPATTs, is also described. In addition, where isolation is not desired, neither the amorphous layer nor the substrate need be made of high resistivity material.

BRIEF DESCRIPTION OF THE DRAWING

Our invention, together with its various features and advantages, can be easily understood from the following more detailed description taken in conjunction with the accompanying drawing, in which.

DETAILED DESCRIPTION

The aforementioned patents, No. 3,615,931 of J. R. Arthur, Jr. and No. 3,751,310 of A. Y. Cho are incorporated herein by reference.

Apparatus

Figure 1:
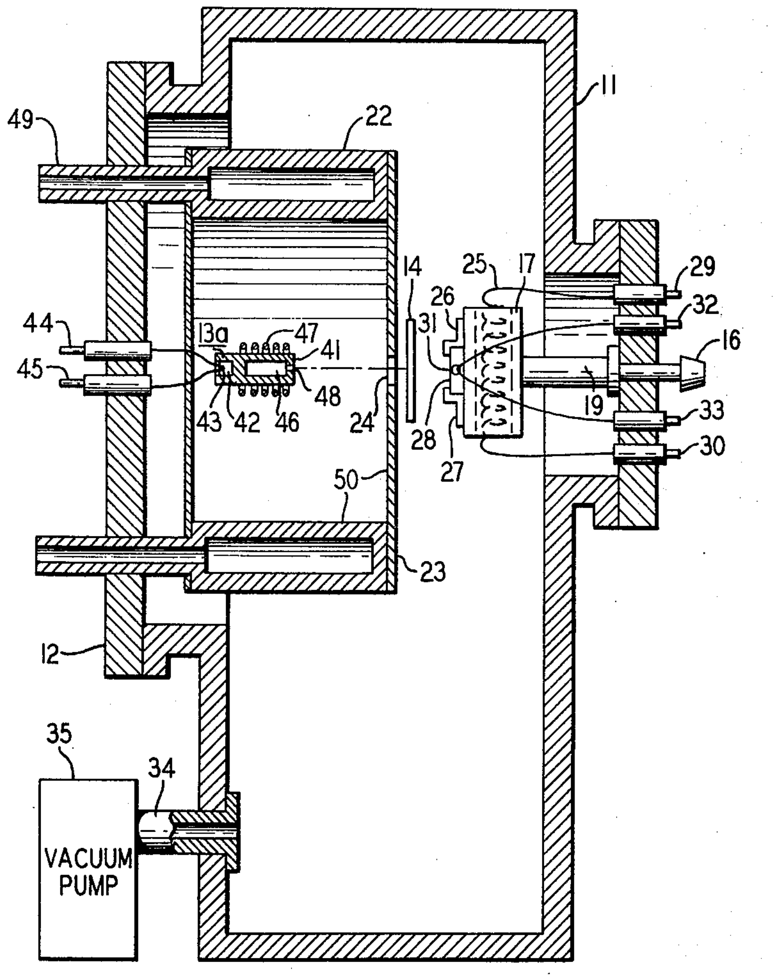
FIG. 1 (PRIOR ART)
FIG. 1 is a partial cross-sectional view of an illustrative apparatus utilized in practicing our invention.
Figure 2:
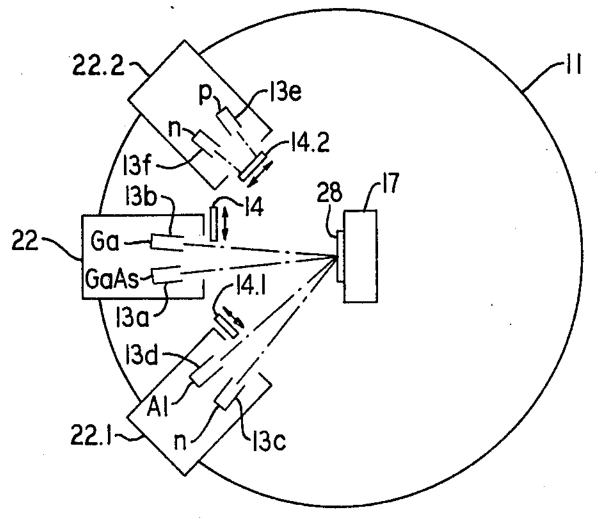
FIG. 2 (PRIOR ART)
FIG. 2 is a schematic top view of only the primary components of apparatus of the type shown in FIG. 1.

Turning now to FIGS. 1 and 2, there is shown apparatus for growing by molecular beam epitaxy (MBE) thin films of semiconductor compounds of controllable thickness and conductivity type.

The apparatus comprises a vacuum chamber 11 having disposed therein a gun port 12 containing illustratively six cylindrical guns 13*a–f*, typically Knudsen effusion cells, thermally insulated from one another by wrapping each cell with heat shielding material not shown (e.g., five layers of 0.5 mil thick knurled Ta foil). A substrate holder 17, typically a molybdenum block, is adapted for rotary motion by means of shaft 19 having a control knob 16 located exterior to chamber 11. Good thermal contact between the substrate and the molybdenum block is illustratively made via a layer of indium (not shown). Each pair of guns (13*a–b*, 13*c–d*, 13*e–f*) are disposed within cylindrical liquid nitrogen cooled shrouds 22, 22.1 and 22.2, respectively. In the prior art, a typical shroud includes an optional collimating frame 23 having a collimating aperture 24. A movable shutter 14 is utilized to block aperture 24 at preselected times when it is desired that the particular molecular beam emanating from gun 13*a* (or 1j3*b*) not impinge upon the substrate. Substrate holder 17 is provided with an internal heater 25 and with clips 26 and 27 for affixing a substrate member 28 thereto. Additionally, a thermocouple is disposed in aperture 31 in the side of substrate 28 and is coupled externally via connectors 32–33 in order to sense the temperature of substrate 28. Chamber 11 also includes an outlet 34 for evacuating the chamber by means of a pump 35.

A typical cylindrical gun 13*a* comprises a refractory crucible 41 having a thermocouple well 42 and a thermocouple 43 inserted therein for the purpose of determining the temperature of the material contained in the gun's source chamber 46. Thermocouple 43 is connected to an external detector (not shown) via connectors 44–45. Source material is inserted in source chamber 46 for vaporization by heating coil 47 which surrounds the crucible. In the prior art the end of crucible 41 adjacent aperture 24 is provided with a knife-edge opening 48 having a diameter preferably less than the average mean free path of atoms in the source chamber. Illustratively, gun 13*a* is 0.65 cm in diameter, 2.5 cm in length, is constructed of $Al_2O_3$ and is lined with spectroscopically pure graphite. The area of opening 48 is typically about 0.17 $cm^2$.

Alternatively, as described by H. C. Casey, Jr., A. Y. Cho and M. B. Panish in copending application Ser. No. 477,975 filed on June 10, 1974, the guns may be made of pyrolitic BN and both collimating frame 23 and the knife-edge opening 48 may be omitted so that certain beams (e.g., Ga, Al, Mg) are sufficiently uncollimated that a relatively large portion of the beams strike the interior wall of the chamber 11 to continuously form fresh layers thereon which getter deleterious contaminants (e.g., $H_2O$, CO, $O_2$ and hydrocarbons).

Note that the removal of the frame 23 and knife-edge opening 48 does not change the fundamental character of the molecular beams; i.e., the arrival rate of the beam at the substrate is substantially constant once the gun temperature is fixed. This characteristic is maintained as long as the aperture of the gun is sufficiently small; e.g., the gun has a diameter of 0.65 cm and a length of 2.5 cm as before.

General MBE Technique

For the purposes of illustration only, the following description relates to the epitaxial growth of a thin film of a Group III(a)-V(a) compound on a GaAs substrate.

The first step in a typical MBE technique involves selecting a single cyrstal substrate member, such as GaAs, which may readily be obtained from commercial sources. One major surface of the GaAs substrate member is initially cut typically along the (001) plane and polished with diamond paste, or any other conventional technique, for the purpose of removing gross surface damage therefrom. An etchant such as a bromine-methanol or hydrogen peroxide-sulphuric acid solution is employed for the purpose of further removing surface damage and to produce a clean substrate surface subsequent to polishing.

Next, the substrate is placed in an apparatus of the type shown in FIGS. 1 and 2, and thereafter, the background pressure in the vacuum chamber is reduced to less than $10^{-6}$ Torr and preferably to a value in the range of about $10^{-8}$ to $10^{-10}$ Torr, thereby reducing the likelihood that deleterious contaminants are introduced onto the substrate surface. Since, however, the substrate surface may be subject to atmospheric contamination before being mounted into the vacuum chamber, the substrate is preferably heated, e.g., to about 600° Centigrade, to provide a substantially atomically clean growth surface (i.e., desorption of contaminants such as S, $O_2$ and $H_2O$). The next steps in the process involve introducing liquid nitrogen into the cooling shrouds via entrance ports 49 and heating the substrate member to the growth temperature which typically ranges from about 450° to 650° Centigrade dependent upon the specific material to be grown, such range being dictated by considerations relating to arrival rates and surface diffusion.

The guns 13*a–f*, employed in the system, have previously been filled with the requisite amounts of the constituents of the desired film to be grown, e.g., gun 13*a* contains a Group III(a)-V(a) compound such as GaAs in bulk form or pure As; gun 13*b* contains a Group III(a) element such as Ga; guns 13*c* and 13*f* contain an n-type dopant such as Sn, Si or Ge in bulk form and; gun 13*c* contains a p-type dopant such as Mg, Be or Ge. In practice, when it is desired to grow a mixed crystal such as AlGaAs, gun 13*d* containing Al is also used. The manner in which Sn and Si are used as n-type dopants and Ge is used as an amphoteric dopant in the growth of Group III(a)-V(a) compounds by MBE is disclosed by A. Y. Cho in Case 2, supra. On the other hand, the manner in which Mg is used as a p-type dopant in the growth of Group III(a)-V(a) compounds containing Al is disclosed by A. Y. Cho and M. B. Panish in copending application Ser. No. 310,209 filed on Nov. 29, 1972.

Following, selected ones of the guns are heated to suitable temperature (not necessarily all the same) sufficient to vaporize the contents thereof to yield (with selected ones of the shutters open) a molecular beam (or beams). Vaporization may occur by evaporation or sublimation depending on whether the gun temperature is above or below, respectively, the melting point of the contents. The distances from the guns to the substrate is typically about 7 cm for a growth area of 2 cm × 2 cm. Under these conditions growth rates from 1000 Angstroms/hr. to 2 $\mu$m/hr. can readily be achieved by varying the temperature of the Ga gun from about 1110° to 1210° Kelvin.

In general the amount of source materials (e.g., Ga, Al and GaAs) furnished to the guns and the gun temperatures should be sufficient to provide an excess of the higher vapor pressure Group V(a) elements (e.g., As) with respect to the lower vapor pressure Group III(a) elements (e.g., Al and Ga); that is, the surface should be As-rich (also referred to as As-stabilized). This condition arises from the large differences in sticking coefficient at the growth temperature of the several materials; namely, unity for Ga and Al and about $10^{-2}$ for $As_2$ on a GaAs surface, the latter increasing to unity when there is an excess of Ga (and/or Al) on the surface. Therefore, as long as the $As_2$ arrival rate is higher than that of Ga and/or Al, the growth will be stoichiometric. Similar considerations apply to Ga and $P_2$ beams impinging, for example, on a GaP substrate.

Growth of the desired doped epitaxial film is effected by directing the molecular beam generated by the guns at the substrate surface. Growth is continued for a time period sufficient to yield an epitaxial film of the desired thickness. This technique permits the controlled growth of films of thickness ranging from a single monolayer (about 3 Angstroms) to more than 100,000 Angstroms.

The reasons which dictate the use of the aforementioned temperature ranges can be understood as follows. Taking Group III(a)-V(a) compounds as an example, it is now known that Group III(a)-V(a) elements, which are adsorbed upon the surface of single crystal semiconductors, have different condensation and sticking coefficients as well as different adsorption lifetimes. Group V(a) elements typically are almost entirely reflected in the absence of III(a) elements when the substrate is at the growth tempeprature. However, the growth of stoichiometric III(a)-V(a) semiconductor compounds may be effected by providing vapors of Group III(a) and V(a) elements at the substrate surface, an excess of Group V(a) elements being present with respect to the III(a) elements, thereby assuring that the entirety of the III(a) elements will be consumed while the nonreacted V(a) excess is reflected. In this connection, the aforementioned substrate temperature range is related to the arrival rate and surface mobility of atoms striking the surface; i.e., the surface temperature must be high enough (e.g., greater than about 450° Centigrade) that impinging atoms retain enough thermal energy to be able to migrate to favorable surface sites (potential wells) to form the epitaxial layer. The higher the arrival rate of these impinging atoms, the higher must be the substrate temperature. On the other hand, the substrate surface temperature should not be so high (e.g., greater than about 650° Centigrade) that extensive noncongruent evaporation results. As defined by C. D. Thurmond in *Journal of Physics Chem. Solids*, 26, 785 (1965), noncongruent evaporation is the preferential evaporation of the V(a) elements from the substrate eventually leaving a new phase containing primarily the III(a) elements. Generally, therefore, congruent evaporation means that the evaporation rate of the III(a) and V(a) elements are equal. In practice, a growth temperature somewhat higher (e.g., 675° Centigrade) than the congruent evaporation temperature may be utilized because the effect of congruent evaporation is modified by the fact that a V(a) beam is striking the substrate surface. The temperatures of the cell containing the III(a) element and of the cell containing the III(a)-V(a) compound, which provides a source of V(a) molecules, are determined by the desired growth rate and the particular III(a)-V(a) system utilized.

Fabrication of Planar Isolated GaAs Devices

Figure 3:
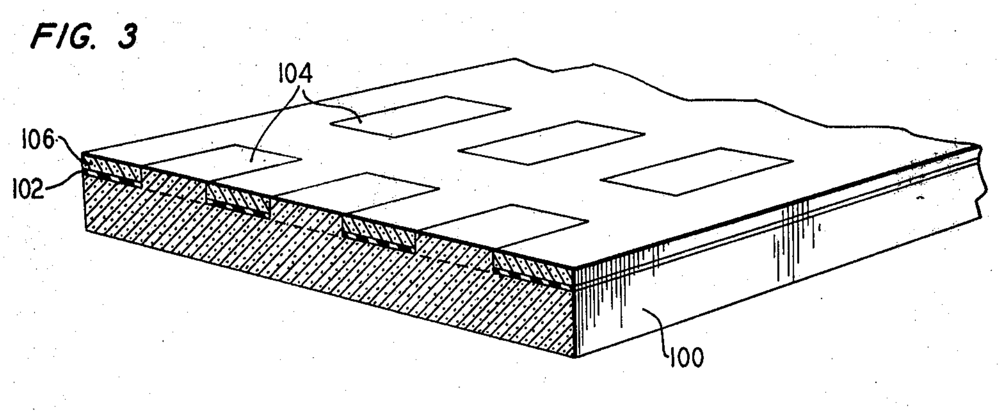
FIG. 3 is a partial cross-sectional and partial pictorial view of a planar structure having islands of monocrystalline material isolated from one another by polycrystalline material fabricated in accordance with one embodiment of our invention.

In order to fabricate planar isolated GaAs devices of the type shown in FIG. 3, we first formed an amorphous insulative layer 102 on a substrate 100. Illustratively, the substrate 100 was a Group III(a)-V(a) material such as GaAs and the amorphous layer 102 was $SiO_2$ or a native oxide. Preferably, the substrate was suitably doped to be at least semi-insulating (e.g., resistivity greater than about $10^5$ Ω-cm). Illustratively, an $SiO_2$ layer may be formed by a SILOX system commerically available from Appied Materials Technology, Inc., 2999 San Ysidro Way, Santa Clara, Cal., whereas a native oxide layer may be formed by an anodization scheme described by B. Schwartz in U.S. Pat. No. 3,798,139 issued on March 19, 1974. Next, windows were opened in the insulative layer to expose predetermined zones of the underlying substrate on which devices were ultimately formed.

Alternatively, preselected portions of a surface layer of the substrate may be converted to amorphous material by grit blasting (e.g., with $Al_2O_3$ particles) or ion bombardment (e.g, with argon ions) with the "windows" suitably masked.

The substrate was then mounted in a vacuum chamber 11 (FIG. 1), and heated to a suitable growth temperature in the range of about 450° to 675° C. Appropriate ones of the guns 13*a–f* (FIG. 2) were heated to produce, with selected ones of the shutters 14 open, one or more molecular beams containing atoms and/or molecules of a Group III(a) element, a Group V(a) element, and a dopant element as previously described.

We found that zones 104 of monocrystalline material of the Group III(a)-V(a) compound epitaxially grew in the windows on the exposed portions of substrate 100, whereas simultaneously in the intermediate regions 106 polycrystalline material of the Group III(a)-V(a) compound formed on the amorphous layer 102. Significantly, we found that (1) the molecular beam formed polycrystalline material on the amorphous layer 102 even though our substrate temperatures were outside the range prescribed by Arthur and Morris (U.S. Pat. No. 3,666,553, supra) for polycrystalline growth on amorphous substrates, and (2) the resistivity of the polycrystalline material was adequate for electrical isolation (>$10^5$ Ω-cm) even though the molecular beam contained a high concentration of dopant atoms.

The Group III(a)-V(a) compound formed in the windows was device quality monocrystalline material. By the growth of multiple layers of suitable thickness, conductivity type and doping profile, various devices such as Schottky barrier diodes, IMPATTs, and planar transistors can be fabricated in the windows. In addition, diffusions in the monocrystalline zones can be carried out using suitable masks such as deposited oxides or anodic native oxides. Regardless of the device, however, the islands of monocrystalline material are electrically isolated from one another by the underlying semi-insulating substrate 100 in combination with the surrounding polycrystalline zones 106.

In the foregoing process, in order to achieve low series resistance in the devices fabricated in the windows, we preferably followed the teachings of A. Y.

Cho and F. K. Reinhart in copending application Ser. No. 373,023 filed on June 25, 1973. That is, one or more of the following steps were executed in our technique: (1) on the substrate a high conductivity buffer layer was first grown; (2) beginning with the buffer layer and until all semiconductor layers of the device are fabricated, the growth process was made to be continuous; and (3) the substrate was heated just prior to the growth of the high conductivity layer while a molecular beam of any element (e.g, arsenic) in the substrate having a relatively high vapor pressure impinges upon the substrate surface in order to suppress the loss of that element from the substrate.

EXAMPLE I

In this example, we describe the fabrication and operation of an *n-n*$^+$ GaAs Schottky barrier mixer diode.

A semi-insulating GaAs substrate doped with Cr to a resistivity of about $10^6$ to $10^7$ Ω-cm was obtained from commercial sources. The substrate which had a nominal (100) orientation was cut and lapped to a thickness of about 20 mils. In practice we found that surfaces which were misoriented by about 2° off (100) in the <110> direction were preferable for growth. The growth surface of the substrate was first polished with 0.5 μ diamond paste to remove saw cut damage. Next, the substrate surface was etch-polished in a bromine methanol solution (e.g., five drops $Br_2$ per 30 cc methanol) and finally rinsed in deionized water.

Upon completion of the substrate preparation, the growth surface was covered with a layer of $SiO_2$ formed by the aforementioned SILOX process carried out at 440° C in a horizontal laminar flow reactor. $SiO_2$ layers ranging from 1500 A to 8,000 A were formed on different substrates by this process.

By standard photolithographic techniques (e.g., buffered HF and a photoresist mask) rectangular windows 75 × 100 μm on 500 μm centers were opened in the $SiO_2$ layer. At this point care was exercised to ensure that no residual $SiO_2$ was left in the windows. After the windows were opened, a well-known low temperature oxygen-plasma was used to remove the photoresist from the remaining portions of the $SiO_2$ layer. Then the exposed substrate surface was etched in 1:10 HF in water for 30 seconds and in HCl for one minute to remove any native oxides which may have formed in the windows from atmospheric exposure. Finally, the substrate was lightly etched with a bromine-methanol solution, rinsed in methanol and then rinsed in deionized water. The rinsed substrate was blown dry with a Freon jet (nitrogen is also suitable) and mounted in a vacuum system of the type shown in FIGS. 1 and 2 in preparation for molecular beam deposition.

The substrate, which measured approximately 2 × 2 cm, was placed about 10 cm from the effusion cells. Only four of the six effusion cells shown in FIG. 2 were utilized; cells 13*a* and 13*b* contained GaAs and Ga, respectively, and cells 13*c* and 13*f* contained Sn. With all of the shutters initially closed, the Ga cell 13*b* was heated to 950° C, the GaAs cell 13*a* to 880° C (mainly to provide an $As_2$ beam), the Sn cells 13*c* and 13*f* to 750° C and 660° C, respectively, in order to generate beams of Ga, $As_2$ and Sn molecules and/or atoms when the shutters were ultimately opened.

The combination of these effusion cell temperatures and substrate position gave a growth rate of about 1 μm/hour.

Prior to growth, however, the pressure of chamber 11 was reduced to about $10^{-8}$ Torr. During growth this pressure increased to about $3 \times 10^{-7}$ Torr due primarily to untrapped arsenic. In order to effect growth, the substrate may be preheated to a suitable temperature in the approximate range of 450° C to 675° C. In this experiment, the temperature of several substrates ranged from 530° C to 670° C in order to determine the effect, if any, of growth temperature on resistivity.

With shutters 14 and 14.1 open, a 6 μm thick $n^+$-GaAs monocrystalline layer 108 (FIG. 4) doped with Sn to $2 \times 10^{18}/cm^3$ was first grown on the substrate 100. While shutter 14 remained open to produce continuous growth, shutter 14.1 was closed and substantially simultaneously shutter 14.2 was opened to effect growth of an 0.3 μm thick n-GaAs monocrystalline layer 110 (FIG. 4) doped with Sn to $1 \times 10^{17}/cm^3$. Note that layer 100 served both as a buffer layer in accordance with Cho-Reinhart Ser. No. 373,023, supra, as well as a functional layer of the mixer diode. Simultaneously with the epitaxial growth of monocrystalline layers 108 and 110 in the windows (zones 104, FIG. 3) polycrystalline GaAs formed in the intermediate zones 106, i.e., on the $SiO_2$ layer 102.

The dual deposition of monocrystalline and polycrystalline GaAs was confirmed with reflection high energy electron diffraction from a 40 keV electron beam impinging on the surface at a grazing angle of less than 1°. We observed streaked ½-order diffraction from the monocrystalline GaAs zones 104 and ring diffraction from the polycrystalline GaAs zones 106. Additional confirmation was obtained by means of photomicrographs of the deposited layers viewed with a Nomarski phase contrast microscope. These photomicrographs showed that (1) on the $SiO_2$ layer the GaAs deposited was polycrystalline with an extremely fine grain structure, (2) in the window the interface between the substrate 100 and epitaxial GaAs layer 108 was essentially featureless, (3) the dimensions of the monocrystalline GaAs zones 104 conformed very precisely to those of the original windows in the oxide, both in dimensions and positioning, thereby indicating that the boundaries between the polycrystalline zones 106 and the monocrystalline zones 104 were straight and sharp, and (4) the upper surface of epitaxial layer 110 grown in the window was approximately level with the upper surface of the surrounding area covered with polycrystalline GaAs: the two differed only by the thickness of the $SiO_2$ layer 102 which can be made sufficiently thin that for device purposes the resultant structure can be considered to be planar.

In order to complete the beam-leaded mixer diode, subsequent device processing to form electrical contacts was carried out using typical planar techniques.

After molecular beam deposition was completed, a layer of $SiO_2$, about 5,500 to 6,500 A thick, was deposited over the slice using the horizontal laminar flow reactor and a deposition temperature of 440°C. This oxide layer is not shown in FIG. 4 because it is removed during subsequent processing. Windows were opened for the U-shaped ohmic contact 112 (FIG. 4) using standard photolithographic techniques and buffered HF. After window opening, the photoresist was removed using a low temperature oxygen plasma. Next a 5:1:1 solution of sulfuric acid, hydrogen peroxide and water was used to remove the portion 110.1 of active layer 110 in the ohmic contact window, thus exposing the buffer layer 108 for contacting. After etching, 500 A of gold, 1000 A of tin and 2500 A of gold were deposited on the slice using a commercially available E-gun system. The ohmic contact 112 was formed by heating the metallized slice to 520° C for 10 seconds in a nitrogen ambient. This "spike alloying" procedure melts the gold-tin layers and results in the formation of an alloyed ohmic contact 112 in the contact window. The excess metal on the oxide outside the contact window area does not wet the oxide, but tends to coalesce into spheres. The excess metal was removed by stripping the oxide in buffered HF and scrubbing in an aqueous solution of a suitable detergent such as TRITON X-100 solution manufactured by Rohm and Haas Company, Independence Mall West, Philadelphia, Pa.

After removing the excess metal and first oxide layer, a second layer 116 of $SiO_2$ (about 5000 to 6000 A thick) was deposited over the slice. Next, a contact window was opened for the Schottky barrier finger-shaped contact 114 and the oxide over the ohmic contact 112 was removed. Then, a titanium, platinum and gold metallization was deposited. The metallization was defined, and thick gold was applied using appropriate photolithography. After metallization and contact definition, the slices were lapped to 40 to 50 $\mu$m in thickness, and the individual devices separated from the slice (FIG. 3) with aqua regia using a photoresist mask. A typical finished device is shown in FIG. 4.

Figure 4:
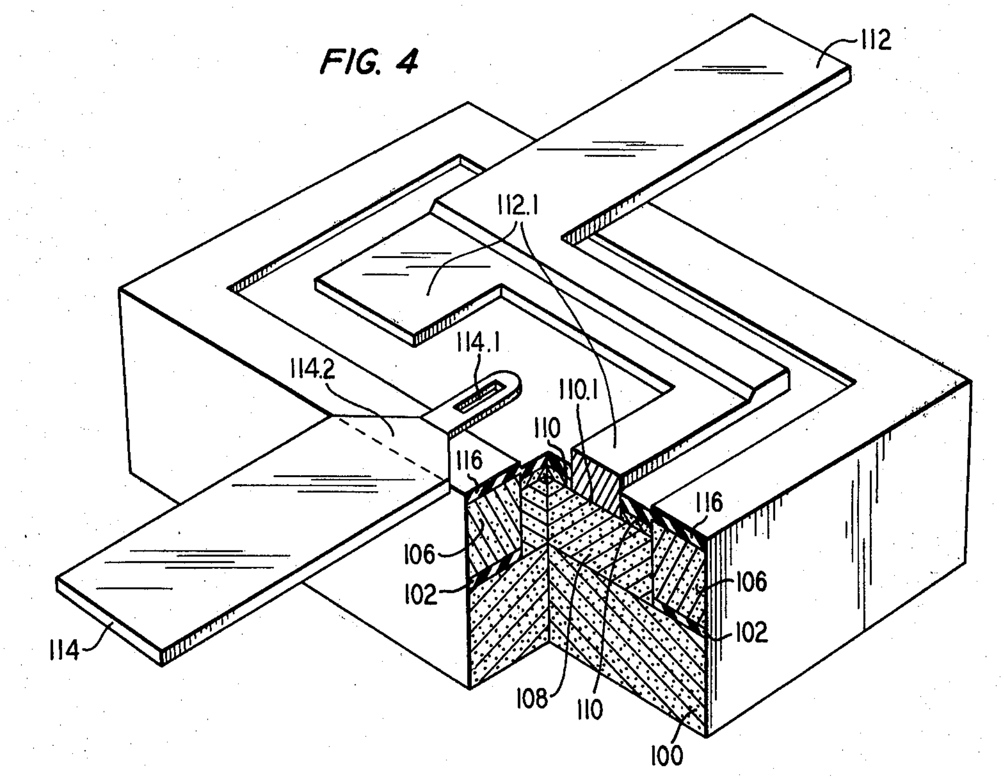
FIG. 4 is a partially cut-away pictorial view of a Schottky barrier mixer diode fabricated in accordance with another embodiment of our invention.

From a device standpoint the mixer diode of FIG. 4 comprises contiguous n- and $n^+$-GaAs monocrystalline layers 108 and 110 bounded on the lower major surface of layer 108 by a Cr-doped semi-insulating monocrystalline GaAs substrate 100. The layers 108 and 110 are laterally surrounded by a region 106 of high resistivity polycrystalline GaAs contiguous with the minor surfaces thereof. The polycrystalline region 106 is separated from the substrate 100 by an amorphous insulative layer 106 such as $SiO_2$ or a native oxide, for example. The device has two electrical contacts: an ohmic contact 112 which is U-shaped to reduce series resistance, and a Schottky barrier contact 114 which is finger-shaped to reduce inductance. The finger portion 114.1 of contact 114 extends into the mouth of the U-shaped portion 112.1 of contact 112. Ohmic contact 112 contacts layer 108 through a U-shaped hole (partially shown at 110.1) in layer 110, and Schottky contact 114 contacts layer 110 at 114.1 through a rectangular hole (not shown) in oxide layer 116. As discussed more fully hereinafter, one important advantage of the device of FIG. 4 is reduced parasitic capacitance due to the fact that portion 114.2 of contact 114 at the edge of the device overlays high resistivity polycrystalline GaAs rather than low resistivity monocrystalline material.

The devices and material were characterized at various steps during the process. Point-contact breakdown voltage measurements after deposition indicated that the monocrystalline zones had normal electrical characteristics while the polycrystalline zones were highly resistive. Measurements between ohmic contacts to the substrate regions of adjacent single crystal areas indicated resistivities of the order of those of the Cr-doped substrates (i.e., $> 10^6$ Ω-cm).

D.C. measurements of the mixer diode devices of FIG. 4 showed that the forward characteristics and capacitance were comparable to similar devices fabricated as mesa structures. In particular, our devices exhibited the following characteristics: the capacitance at $V=0$ was 0.04 to 0.06 pF; the parasitic capacitance was about 0.02 pF; the forward series resistance at 5.0 mA was 4 to 8 Ω; and the Schottky barriers had $n$ factors of 1.1 to 1.3.

It should be noted that, except in the immediate area of the junction (i.e., Schottky barrier), devices may be our method have beam leads which traverse semi-insulating polycrystalline material over a semi-insulating monocrystalline substrate. Thus, the parasitic capacitance between the beam and the substrate is very small compared to similar prior art devices formed on conducting substrates. In addition, the planar structure of our device makes device fabrication relatively easy compared to mesa structure techniques. In particular, one photoresist step, as well as the complicated etching and metallization steps of mesa fabrication, are eliminated.

Several devices of the type shown in FIG. 4 were tested in a double-balanced downconverter configuration. Four diodes were bonded to a thin film circuit in an "orthomode" configuration which was placed in a waveguide carrying energy at a nominal frequency of 51.5 GHz. A pump signal at 50.129 GHz was applied across contacts 112 and 114. The output signal taken from the downconverter had a frequency of 1.371 GHz and the conversion loss was 5.3 dB at 51.5 GHz, well within system requirements for a millimeter wave communication system. During r.f. testing of the devices, it was found that the circuits using these devices could be pumped more efficiently than previously measured devices fabricated on $n^+$ substrates. That is, the devices produced a greater output voltage swing per unit input current. This effect appears to be related to parasitic capacitance and skin conduction at high frequencies.

EXAMPLE II

The basic growth procedure of Example I was followed in a simpler apparatus which incorporated a single cooling shroud, having a single shutter. Three effusion cells were located within the shroud: one contained GaAs, one Ga and the other Sn. Consequently, the transition between $n$-type layers 108 and 110 (FIG. 4) was not abrupt. That is, layer 108 was grown with the Sn-cell at 750° C. Then, with the shutter still open and all the cells heated to produce molecular beams, the temperature of the Sn-cell was reduced to 660° C in about one minute. Since the growth rate was about 1 $\mu$m per hour, the transition zone between layers 108 and 110 was only about 1/60 th of a micrometer or less than 200 A. Mixer diodes fabricated by this technique on $SiO_2$-masked Cr-doped substrates exhibited characteristics similar to those of Example I.

EXAMPLE III

In order to determine the effect of depositing p-type GaAs layers, we repeated the basic growth procedure of Example I except that only three of the six effusion cells were used: cell **13*e* contained a p-type dopant (Mg) and, as before, cells 13*a* and 13*b* contained GaAs and Ga, respectively. Cells 13*a*, 13*b* and 13*e*** were heated to temperatures of 880° C, 950° C and 440° C, respectively. A 6 $\mu$m thick p-GaAs layer was deposited on the $SiO_2$ layer and in the windows on the Cr-doped GaAs substrate which was heated to 615° C. Ohmic contacts to the layer in the windows were formed by a capacitor discharge bonding technique with 50 $\mu$m Zn-doped Au wires.

Polycrystalline GaAs formed on the $SiO_2$ layer and monocrystalline p-GaAs doped with Mg to about $5 \times 10^{16}/cm^3$ was deposited in the windows. The Mg-doped polycrystalline GaAs had a resistivity about ten times less than that of the Sn-doped polycrystalline layers of Example I, but was still adequate for electrical isolation purposes.

EXAMPLE IV

In order to determine the effect of unintentional doping, we repeated the basic procedure of Example I except that only two of the six effusion cells were used: cell 13*a* contained GaAs and was heated to 880° C and cell 13*b* contained Ga and was heated to 950° C. A 6 $\mu$m thick GaAs layer was deposited on the $SiO_2$ layer and in the windows on the Cr-doped GaAs substrate which was heated to 550° C. Ohmic contacts to the layer in the windows were formed by a capacitive discharge bonding technique with 50 $\mu$m Sn-doped Au wires.

Polycrystalline GaAs formed on the $SiO_2$ layer and monocrystalline n-GaAs with an impurity concentration of about $5 \times 10^{15}/cm^3$ was deposited in the windows. The unintentionally doped n-type polycrystalline layer had a resistivity five times higher than the *n*-type layers of Example I.

EXAMPLE V

In order to determine the effect of incorporating Al into the deposited GaAs layers, we repeated the basic growth procedure of Example III using four of the six effusion cells of FIG. 2: cells 13*a*, 13*b*, 13*c* and 13*d* contained, respectively, As, Ga, Mg and Al which were heated, respectively, to temperatures of about 340° C, 1000° C, 350° C, and 1280° C. An 8 $\mu$m thick p-$Al_{0.2}Ga_{0.8}As$ layer was deposited on the $SiO_2$ layer and in the windows on the Cr-doped substrate which was heated to about 550° C. Note that polycrystalline As was used as the source of the $As_2$ beam rather than GaAs although the latter is also suitable.

Polycrystalline $Al_{0.2}Ga_{0.8}As$ formed on the $SiO_2$ layer and monocrystalline p-$Al_{0.2}Ga_{0.8}As$ doped with Mg to about $1 \times 10^{18}/cm^3$ was deposited in the windows. The Mg-doped polycrystalline AlGaAs had a resistivity which was about the same as that of the Mg-doped polycrystalline GaAs layers of Example III.

EXAMPLE VI

In order to determine the effect of depositing Group III(a)-V(a) compound layers on amorphous insulative layers other than $SiO_2$, a 2000 A thick native oxide layer was formed on a Cr-doped GaAs substrate utilizing an anodic oxidation scheme described by B. Schwartz in U.S. Pat. No. 3,798,139 issued on Mar. 19, 1974. Windows were opened in the native oxide layer by means of well-known masking and etching techniques. Except for the nature of the amorphous layer being a native oxide rather than $SiO_2$, we repeated the basic procedure of Example I using only three of the six effusion cells. Cells 13*a*, 13*b* and 13*f* contained GaAs, Ga and Ge, respectively, and were heated to about 870° C, 940° C, and 780° C, respectively, An 8 $\mu$m thick n-GaAs layer was deposited on the native oxide layer and in the windows on the Cr-doped GaAs substrate which was heated to about 560° C.

Polycrystalline GaAs formed on the native oxide layer and monocrystalline n-GaAs doped with Ge to about $10^{18}/cm^3$ was deposited in the windows. The Ge-doped polycrystalline GaAs had a resistivity about the same as that of the Sn-doped polycrystalline GaAs layers of Example I.

In addition to $SiO_2$ and native oxide layers, the amorphous layer used in the practice of our invention could comprise silicon nitride.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

Figure 5:
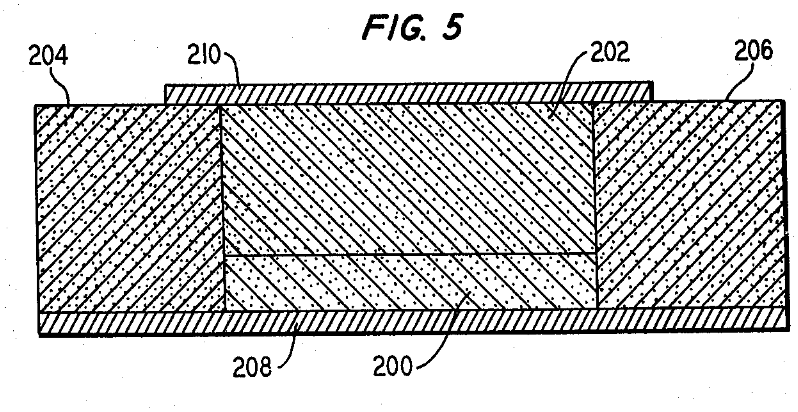
FIG. 5 is a schematic of a sealed-junction IMPATT device which may be fabricated in accordance with a third embodiment of our invention.

In particular, our invention is applicable to the fabrication of multiple devices and integrated circuits suitable for microwave systems, for example. One potential advantage for microwave integrated circuits lies in the reduction of parasitic lead inductance and capacitance made possible by integrating the device within the circuit. One circuit configuration envisioned, for example, includes a strip-line type circuit formed on a semi-insulating wafer having polycrystalline isolation zones as previously described with the active devices formed in the monocrystalline zones. In particular, one device of interest is the GaAs Schottky barrier IMPATT structure shown in FIG. 5 comprising an n-epitaxial GaAs layer 200 and a contiguous $n^+$-epitaxial GaAs layer 202. The layers 200 and 202 are laterally bounded by zones of high resistivity polycrystalline GaAs 204 and 206 formed in the manner previously described. In this case the substrate on which the device structure is fabricated is subsequently removed by suitable means such as lapping and etching. Then a Schottky barrier contact 208 is formed on one major surface of the structure in contact with the n-GaAs layer 200 and an ohmic contact 210 is formed on the opposite major surface of the structure in contact with $n^+$-GaAs layer 202. One feature of this device is a sealed junction which has advantages well known in the art and may even make it unnecessary to package the device. Monolithic multiple IMPATT devices utilizing well-known plated heat sinks could be readily fabricated utilizing the above structure and the procedures previously described.

Application of our invention, however, is not limited to high frequency devices. One possible embodiment is an integrated circuit for high temperature operation.

Moreover, the monocrystalline zones need not be either simple n- or p-type layers. Alternating layers of p- and n-type material of various impurity concentrations and thickness are also contemplated. In addition, diffusions into the monocrystalline zones can be carried out utilizing suitable masks and wellknown technology.

What is claimed is:

1. A method of fabricating planar isolated semiconductor devices comprising the steps of:

a. forming an amorphous insulative layer on a major surface of a substrate comprising a compound of a Group III(a)-V(a) material; said substrate being at least semi-insulating;

b. removing selected portions of said amorphous layer to form a plurality of windows which expose the underlying substrate;

c. placing said substrate in an evacuable chamber;

d. reducing the pressure of said chamber to a subatmospheric pressure;

e. preheating said substrate to a temperature in the range of 450° to 675° C approximately; and f. directing at least one molecular beam comprising at least one Group III(a) element and at least one Group V(a) element at said major surface so that monocrystalline material comprising a compound of said elements is deposited in said windows and on said substrate and simultaneously polycrystalline material comprising the same compound of said elements is deposited on said amorphous layer, said polycrystalline material being of sufficiently high resistivity to produce electrical isolation between said devices formed in separate ones of said windows and being substantially coplanar with said monocrystalline material.

2. The method of claim 1 wherein step (a) includes forming said amorphous layer by grit blasting said selected portions of said major surface.

3. The method of claim 1 wherein said at least one molecular beam includes at least one dopant element to modify the conductivity type of said monocrystalline material.

4. The method of claim 3 wherein said at least one molecular beam is effective to deposit in said window and on said substrate a first monocrystalline layer having a first carrier concentration and a second monocrystalline layer having a lower carrier concentration.

5. The method of claim 4 wherein said first and second layers have the same conductivity type.

6. The method of claim 5 wherein said at least one beam is effective to grow a first layer having one conductivity type and a second layer having the opposite conductivity type.

7. A method of claim 1 wherein step (a) includes forming said amorphous insulative layer from a material selected from the group consisting of silicon dioxide, silicon nitride and native oxides.

8. The method of claim 1 wherein said substrate comprises GaAs, said at least one Group III(a) element includes Ga and said at least one V(a) element includes As.

9. The method of claim 8 wherein said at least one III(a) element also includes A1.

10. The method of claim 8 wherein said substrate comprises Cr-doped GaAs.

11. The method of claim 10 wherein said at least one molecular beam includes at least one dopant element to modify the conductivity type of said monocrystalline material.

12. The method of claim 11 wherein said dopant is selected from the group consisting of Sn, Si and Ge when it is desired to make said monocrystalline material n-type and is selected from the group consisting of Ge, Be and Mg when it is desired to make said monocrystalline material p-type.

13. A method of fabricating planar isolated semiconductor devices from materials containing compounds including Ga and As comprising the steps of:

a. forming an amorphous insulative layer on a major surface of a semi-insulating GaAs substrate, said insulative layer comprising a material selected from the group consisting of silicon dioxide, silicon nitride and native oxides;

b. removing selected portions of said insulative layer to form a plurality of windows which expose portions of the underlying substrate;

c. placing said substrate in an evacuable chamber and reducing the background pressure of said chamber to at least $10^{-6}$ Torr approximately;

d. just prior to step (e) preheating said substrate to a temperature in the range of 450° to 675° C under condition of excess As pressure at said surface;

e. directing at least one first molecular beam comprising Ga, As and the dopant upon said surface to deposit a monocrystalline GaAs buffer layer in said windows and on said substrate and simultaneously to deposit a relatively high resistivity polycrystalline GaAs first layer on said insulative layer;

f. directing at least one second molecular beam comprising a Group III(a) element, a Group V(a) element and a dopant element upon said buffer layer and said polycrystalline layer for a time period sufficient to effect growth of a second monocrystalline GaAs layer on said buffer layer and a second polycrystalline GaAs layer on said first polycrystalline layer;

g. maintaining the relative proportion of the constitutents of said first and second molecular beams so that at the growth surface there is an excess of Group V(a) elements with respect to Group III(a) elements; and h. beginning with step (e) and until said buffer layer and all layers of said device are deposited, maintaining the deposition process continuous.

14. The method of claim 13 wherein said substrate comprises Cr-doped GaAs.

15. The method of claim 14 wherein in step (f) said Group III(a) element includes Ga, said Group V(a) element includes As and in steps (e) and (f) said dopant is selected from the group consisting of Sn, Si and Ge when the conductivity type of said monocrystalline material is to be made n-type and is selected from the group consisting of Ge, Be and Mg when the conductivity type of said monocrystalline material is to be made p-type.

16. The method of claim 13 wherein said buffer layer comprises $n^+$ -GaAs, said second monocrystalline layer comprises $n$-GaAs and including the additional steps of:

i. forming a second insulative layer on said second monocrystalline layer and said second polycrystalline layer;

j. forming a first contact window in said second insulative layer to expose said second monocrystalline layer;

k. removing the portion of said second monocrystalline layer in said window to expose the underlying $n^+$-GaAs monocrystalline layer;

l. forming an ohmic contact to said $n^+$-GaAs monocrystalline layer through said first contact window;

m. removing the remaining portions of said second insulative layer;

n. forming a third insulative layer over said n-GaAs monocrystalline second layer;

o. forming a second contact window in said third insulative layer to expose the underlying $n$-GaAs monocrystalline layer; and p. forming a Schottky barrier contact to said $n$-GaAs monocrystalline layer through said second window.

17. The method of claim 16 wherein in step (1) a beam lead U-shaped ohmic contact is formed, and in step (p) a beam lead Schottky barrier contact is formed having a narrow finger portion which overlays said $n$-GaAs monocrystalline layer and has a wider portion which overlays said second polycrystalline GaAs layer, said finger portion extending into the mouth of the U-shaped portion of said ohmic contact.

* * * * *